(12) United States Patent
Aschenbrenner et al.

(10) Patent No.: US 7,390,961 B2
(45) Date of Patent: Jun. 24, 2008

(54) INTERCONNECTION OF SOLAR CELLS IN A SOLAR CELL MODULE

(75) Inventors: Peter Aschenbrenner, Palo Alto, CA (US); Douglas H. Rose, Austin, TX (US); Shandor G. Daroczi, Santa Clara, CA (US); Stephen J. Coughlin, Mt. View, CA (US); Charles F. Gay, Westlake Village, CA (US)

(73) Assignee: Sunpower Corporation, San Jose, CA (US)

( * ) Notice: Subject to any disclaimer, the term of this patent is extended or adjusted under 35 U.S.C. 154(b) by 379 days.

(21) Appl. No.: 11/140,460

(22) Filed: May 27, 2005

(65) Prior Publication Data

US 2005/0268959 A1 Dec. 8, 2005

Related U.S. Application Data

(60) Provisional application No. 60/577,056, filed on Jun. 4, 2004.

(51) Int. Cl.
*H01L 31/00* (2006.01)
(52) U.S. Cl. ..................... 136/244; 136/256
(58) Field of Classification Search ......... 136/243–265
See application file for complete search history.

(56) References Cited

U.S. PATENT DOCUMENTS

| | | | |
|---|---|---|---|
| 4,927,770 A | 5/1990 | Swanson | |
| 5,011,544 A * | 4/1991 | Gaddy et al. | 136/246 |
| 5,053,083 A | 10/1991 | Sinton | |
| 5,100,808 A * | 3/1992 | Glenn | 438/68 |
| 5,164,019 A | 11/1992 | Sinton | |
| 5,360,990 A | 11/1994 | Swanson | |
| 5,369,291 A | 11/1994 | Swanson | |
| 5,660,646 A * | 8/1997 | Kataoka et al. | 136/251 |
| 6,274,402 B1 | 8/2001 | Verlinden et al. | |
| 6,313,395 B1 | 11/2001 | Crane et al. | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |

OTHER PUBLICATIONS

"Flipper Turbot Build Sheet" website http://www.jwgoerlich.solarbotics.net/robots/flipper/build_sheet.htm, illustrating work completed in Oct. 2003. 4 pages.*

"Flipper" website http://jwgoerlich.solarbotics.net/robots/flipper/default.htm, illustrating work completed in Oct. 2003. 1 page.*

(Continued)

*Primary Examiner*—Nam X Nguyen
*Assistant Examiner*—Jeffrey T Barton
(74) *Attorney, Agent, or Firm*—Okamoto & Benedicto LLP

(57) ABSTRACT

In one embodiment, a solar cell module comprises a plurality of solar cells interconnected as a solar cell array. An interconnect assembly electrically connects the backsides of two adjacent solar cells. The interconnect assembly may have an interconnect that electrically connects a contact point on a backside of a solar cell to a contact point on a backside of another solar cell. The interconnect assembly may further include an interconnect shield placed between the solar cells and the interconnect.

17 Claims, 8 Drawing Sheets

OTHER PUBLICATIONS

D.M. Considine, ed, "Van Nostrand's Scientific Encyclopedia". New York: Van Nostrand Reinhold, p. 1096. (1989) Entry on "Ethylene-Vinyl-Acetate Copolymers".*

C. W. Paul, "Hot-Melt Adhesives" MRS Bulletin, Jun. 2003. pp. 440-444.*

Website "Adhesives 101", http://www.glue-store.com/adhesives101.html from Jun. 5, 2002, available from www.archives.org, 6 pages.*

Website "CSE Distributors PVC Tape", http://www.csedistributors.com/acatalog/PVC_Tape.html from Oct. 12, 2002, available from www.archive.org, 2 pages.*

W.P. Mulligan, et al., "A Flat-Plate Concentrator: Micro-Concentrator Design Overview", 2000, 3 sheets; Proceedings of the 28th IEEE PVSC.

Keith R. McIntosh, et al., "The Choice of Silicon Water for the Production of Low-COst Rear-Contact Solar Cells", May 2003, 4 sheets; Sunnyvale, California.

P.J. Verlinden, et al., "Will We Have a 20%-Efficient (PTC) Photovoltaic System?", 2001, 6 sheets; Proceedings of the 17th Europe Photovoltaic Solar Energy Conference.

William P. Mulligan, et al., "Development of Chip-Size Silicon Solar Cells", 6 sheets; Proceedings of the 28th IEEE PVSC.

Akira Terao, et al., "A Mirror-Less Design for Micro-Concentrator Modules", 2000, 4 sheets; Proceedings of the 28th IEEE PVSC.

P.J. Verlinden, et al., "Backside-Contact Silicon Solar Cells with Improved Efficiency for the '96 World Solar Challenge", 1997, 5 sheets Proceedings of the 15th EPSEC.

P.J. Verlinden, et al., "One-Year Comparison of a Concentrator Module with Silicon Point-Contact Solar Cell to a Fixed Flat Module in Nothern California", 2000, 4 sheets; Proceedings of the 16th EPSEC.

Richard M. Swanson, "The Promise of Concentrators", 2000, pp. 93-111, Progress in Photovoltaics: Research and Applications.

* cited by examiner

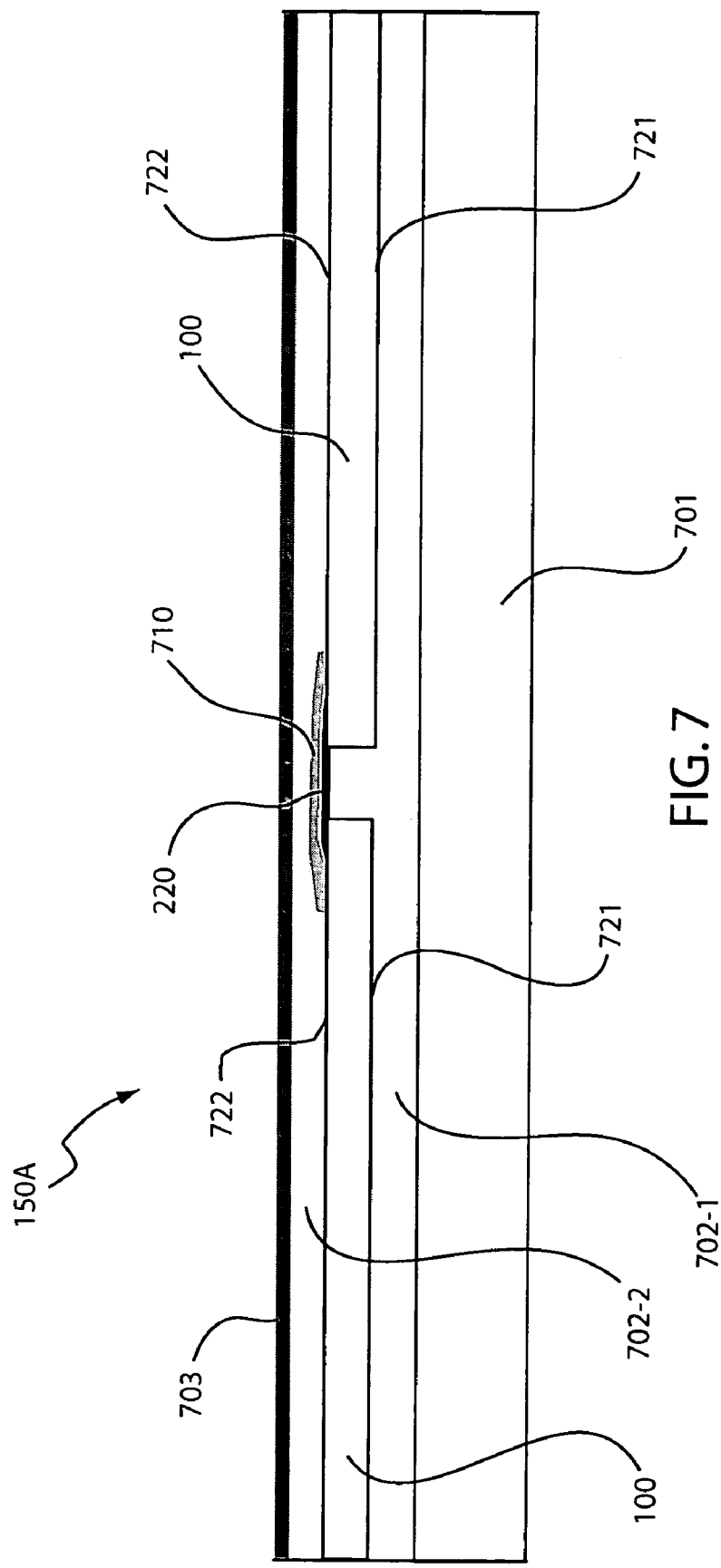

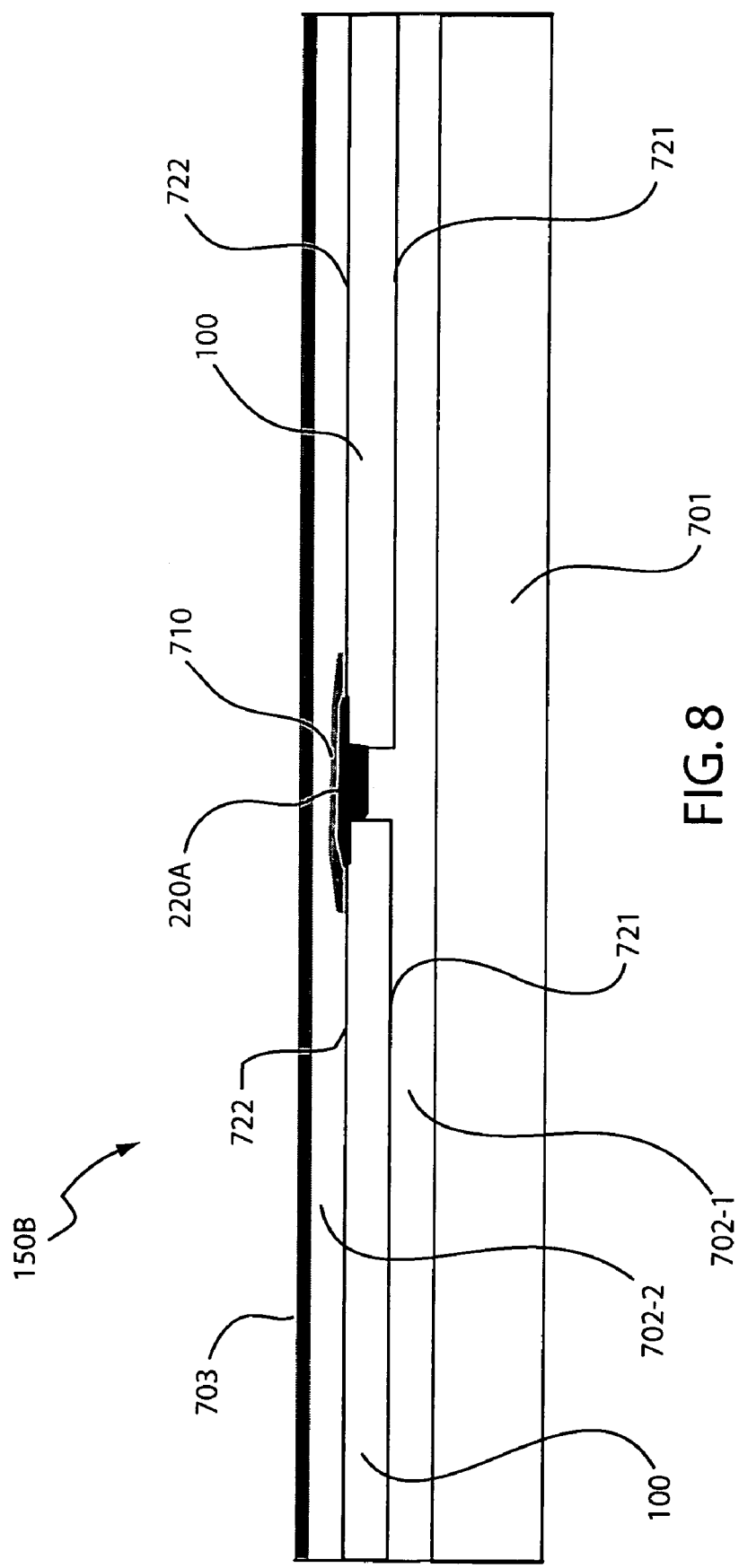

INTERCONNECTION OF SOLAR CELLS IN A SOLAR CELL MODULE

CROSS-REFERENCE TO RELATED APPLICATION(S)

This application claims the benefit of U.S. Provisional Application No. 60/577,056, filed on Jun. 4, 2004, entitled "Solar Cell Interconnect Shield," which is incorporated herein by reference in its entirety.

BACKGROUND OF THE INVENTION

1. Field of the Invention

The present invention relates generally to solar cells, and more particularly but not exclusively to methods and structures for interconnecting solar cells in a solar cell module.

2. Description of the Background Art

Solar cells, also referred to as "photovoltaic cells," are well known devices for converting solar radiation to electrical energy. They may be fabricated on a semiconductor wafer using semiconductor processing technology. Generally speaking, a solar cell may be fabricated by forming p-doped and n-doped regions in a silicon substrate. Solar radiation impinging on the solar cell creates electrons and holes that migrate to the p-doped and n-doped regions, thereby creating voltage differentials between the doped regions. In a backside-contact solar cell, the doped regions are coupled to conductive leads on the backside of the solar cell to allow an external electrical circuit to be coupled to and be powered by the solar cell. Backside-contact solar cells are disclosed in U.S. Pat. Nos. 5,053,083 and 4,927,770, which are both incorporated herein by reference in their entirety.

Several solar cells may be connected together to form a solar cell array. In a solar cell array, a conductive area coupled to a p-doped region (hereinafter "positive area") of one solar cell is connected to a conductive area coupled to an n-doped region (hereinafter "negative area") of an adjacent solar cell. The positive area of the adjacent solar cell is then connected to a negative area of a next adjacent solar cell and so on. This chaining of solar cells may be repeated to connect several solar cells in series to increase the output voltage of the solar cell array. Backside-contact solar cells have been connected together using a relatively long, single strip of perforated conductive material. U.S. Pat. No. 6,313,395, which is incorporated herein by reference in its entirety, also discloses the interconnection of several backside-contact solar cells to form a solar cell array.

Attempts have been made to visually shield front-side electrical connections of traditional (i.e., front side contact) solar cells. For example, Webasto Roof Systems, Inc. has introduced a traditional solar cell array with bus bars that are covered with paint or tape to make the solar cell array visually appealing for use in the roofs of automobiles. Electrical connections to a traditional solar cell are made to contact portions on the front side (i.e., the side facing the sun) of the solar cell. Because backside-contact solar cells have all the electrical connections on the backside, conventional approaches to shielding electrical connections in traditional solar cells are not readily applicable to backside-contact solar cells.

SUMMARY

In one embodiment, a solar cell module comprises a plurality of solar cells interconnected as a solar cell array. An interconnect assembly electrically connects the backsides of two adjacent solar cells. The interconnect assembly may have an interconnect that electrically connects a contact point on a backside of a solar cell to a contact point on a backside of another solar cell. The interconnect assembly may further include an interconnect shield placed between the solar cells and the interconnect.

These and other features of the present invention will be readily apparent to persons of ordinary skill in the art upon reading the entirety of this disclosure, which includes the accompanying drawings and claims.

DESCRIPTION OF THE DRAWINGS

FIG. 3(*b*) schematically shows an interconnect shield over an interconnect, in accordance with an embodiment of the present invention.

FIG. 7 schematically shows a cross-section of a solar cell module in accordance with an embodiment of the present invention.

FIG. 8 schematically shows a cross-section of a solar cell module in accordance with another embodiment of the present invention.

The use of the same reference label in different drawings indicates the same or like components. Drawings are not necessarily to scale unless otherwise noted.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
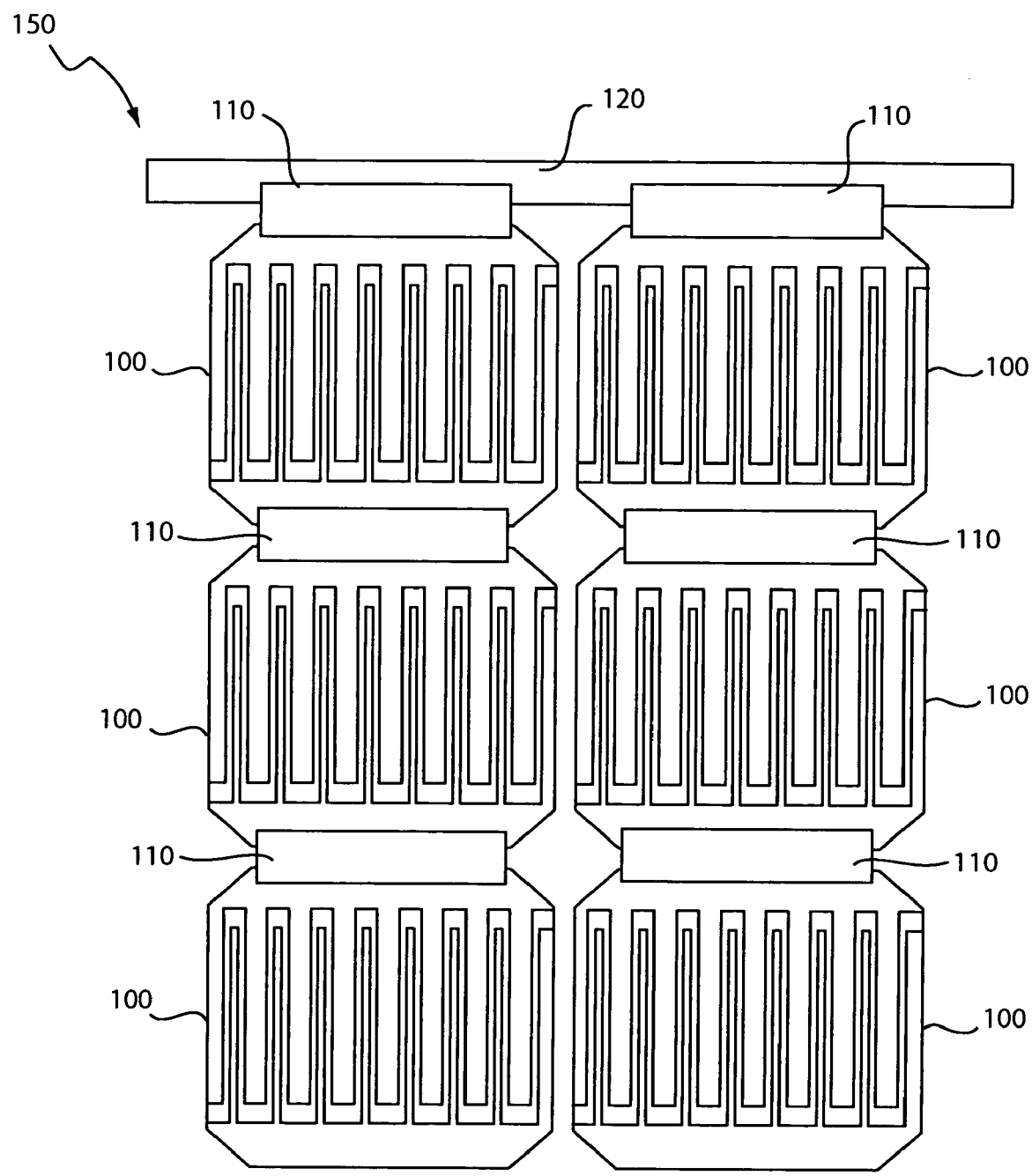
FIG. 1 schematically shows a solar cell module in accordance with an embodiment of the present invention.

FIG. 1 schematically shows a solar cell module 150 in accordance with an embodiment of the present invention. The solar cell module 150 includes solar cells 100, interconnect assemblies 110, and one or more bus bars 120. Other components of the solar cell module 150, such as back sheets, protective layers, additional solar cells, additional bus bars and interconnect assemblies, are not shown in FIG. 1 for clarity of illustration. FIG. 1 shows the backsides of the solar cells 100. The side opposite to the backside of a solar cell is referred to as the "front side." As installed in the field, the front sides of the solar cells 100 are oriented to face the sun.

In one embodiment, the solar cells 100 comprise backside-contact solar cells. That is, electrical connections to the solar cells 100 are made from their backsides. An interconnect assembly 110 electrically connects a solar cell 100 to an adjacent solar cell 100 or to a bus bar 120. Interconnected solar cells are also collectively referred to as a "solar cell array." In the example of FIG. 1, an interconnect assembly 110 electrically connects the positive contact points of a solar cell 100 to corresponding negative contact points of another solar cell 100. Interconnecting the solar cells 100 together increases the output voltage of the solar cell array.

Figure 2A:
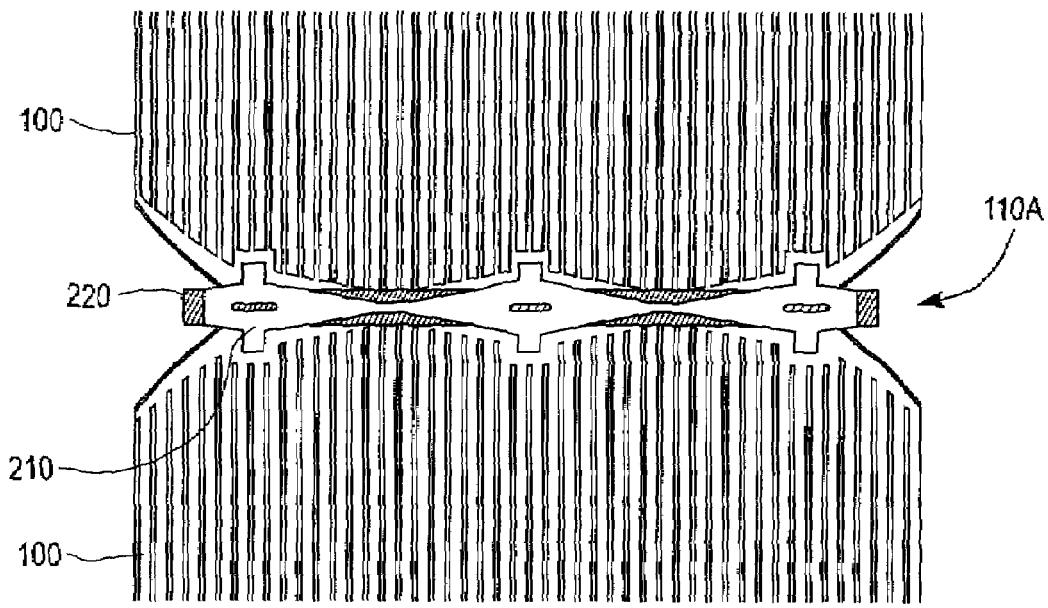
FIGS. 2(*a*) and 2(*b*) schematically show the backsides and front sides, respectively, of solar cells interconnected using an interconnect assembly in accordance with an embodiment of the present invention.

FIG. 2(a) schematically shows the backsides of solar cells 100 that are electrically connected together using an interconnect assembly 110A, in accordance with an embodiment of the present invention. The interconnect assembly 110A is a specific embodiment of the interconnect assemblies 110 shown in FIG. 1. In the example of FIG. 2(a), the interconnect assembly 110A comprises an interconnect 210 and an interconnect shield 220. The interconnect shield 220 may be applied to the interconnect 210 prior to electrically connecting (e.g., by soldering) the interconnect 210 to contact points (e.g., soldering pads) on the backsides of the solar cells 100. In one embodiment, the interconnect shield 220 is attached to the interconnect 210 to form the interconnect assembly 110A. The interconnect assembly 110A is pressed onto the backsides of the solar cells 100, with the interconnect shield 220 pressing against the solar cells 100. The interconnect 210 is then soldered onto soldering pads on the backsides of the solar cells 100. It is to be noted that since the interconnect shield 220 is between the interconnect 210 and the solar cells 100, the interconnect shield 220 is an integral part of the solar cell array and is preferably applied to either the solar cells 100 or the interconnect 210 prior to assembling the solar cell array together.

The interconnect shield 220 advantageously provides electrical isolation between the interconnect 210 and the edges of the solar cells 100 in areas other than soldering pads, thereby preventing efficiency reducing electrical paths in cells susceptible to these paths. That is, the interconnect shield 220 helps improve conversion efficiency by preventing electrical contact between material that is used to electrically connect the solar cells 100 and areas of the solar cells 100 that would form unwanted shunt paths. The interconnect shield 220 also advantageously prevents substances from migrating to the front sides of the solar cells 100 during and after the manufacturing process. For example, the interconnect shield 220 prevents solder flux from migrating to the front sides of the solar cells 100 during soldering. Furthermore, as illustrated in FIG. 8, the interconnect shield 220 may be used as reference in spacing solar cells 100 in the solar cell array. In other words, the interconnect shield 220 may be used as a cell-to-cell gap spacer for assembly symmetry and aesthetics and for long-term reliability control by regulating solar cell spacing to high tolerances.

Figure 2B:
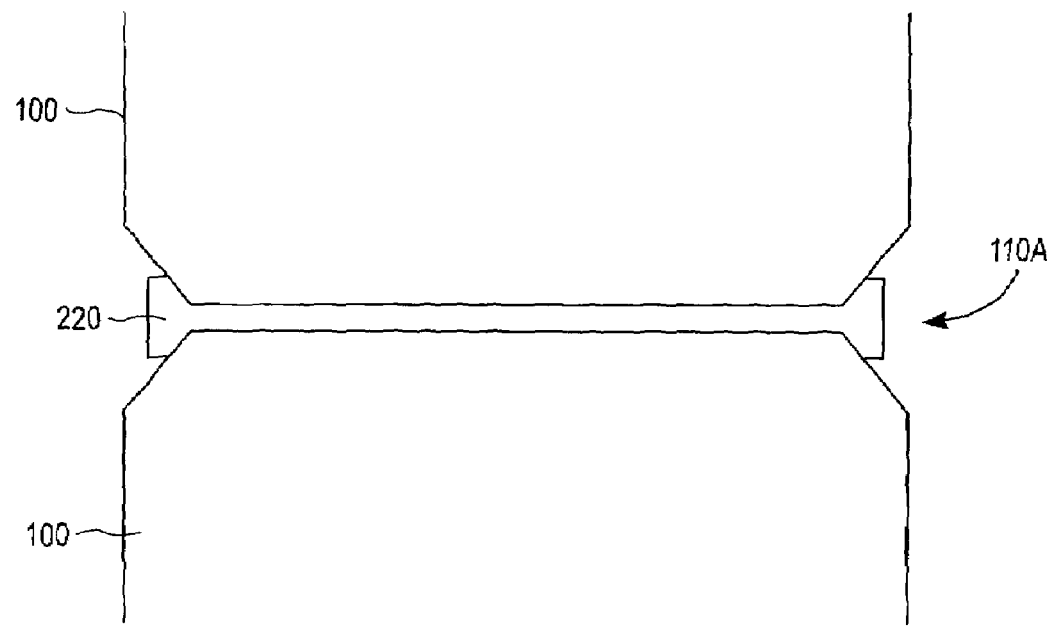

FIG. 2(b) schematically shows the front sides of the solar cells 100 of FIG. 2(a). As mentioned, the front sides of the solar cells 100 face the sun in a typical installation, and thus are visible portions of the solar cell module. As shown in FIG. 2(b), the interconnect shield 220 visually hides the interconnect 210 (see FIG. 2(a)) from the front sides of the solar cells 100. That is, without the interconnect shield 220, the interconnect 210 would be visible between gaps on the front sides of the solar cells 100. This not only makes the solar cell array more visually appealing, but also advantageously helps improve conversion efficiency by providing a light-scattering surface that directs light into adjacent solar cells 100 where the light may be captured and converted to electricity. The interconnect shield also visually blocks EVA that might have become brown from interaction with the Cu interconnect or other materials between cells. Furthermore, selection of colors of the interconnect shield and backsheet allow for a range of visual appearances.

Figure 3A:
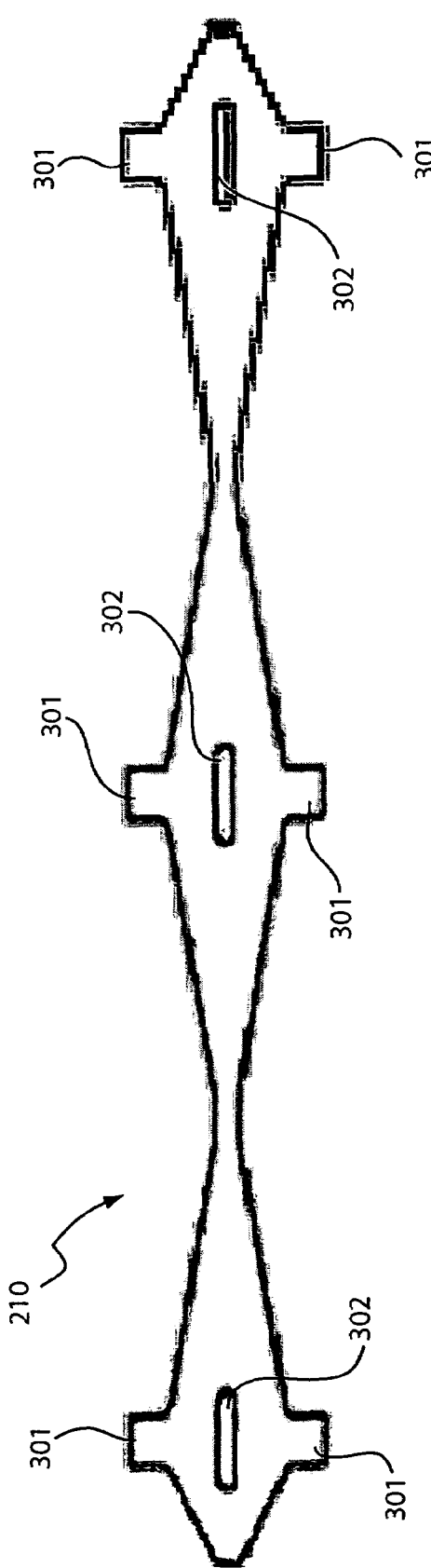
FIG. 3(*a*) schematically shows an interconnect in accordance with an embodiment of the present invention.

FIG. 3(a) schematically shows an interconnect 210 in accordance with an embodiment of the present invention. In the example of FIG. 3(a), the interconnect 210 comprises a single continuous electrically conductive material having several regions. Each region of the interconnect 210 may have a diamond-shaped body, tabs 301 and an in-plane slit 302 or other strain-relief features. Tabs 301 may be soldered onto contact points on the solar cells 100. Slits 302 advantageously provide strain relief, which is particularly important in solar cell applications because components of the solar cell module may expand and contract due to heat exposure. As is evident from FIG. 3(a), the interconnect 210 is a single-piece design, making the interconnect 210 more robust and durable for field use and easier to attach to solar cells 100 by automated assembly.

Figure 3B:
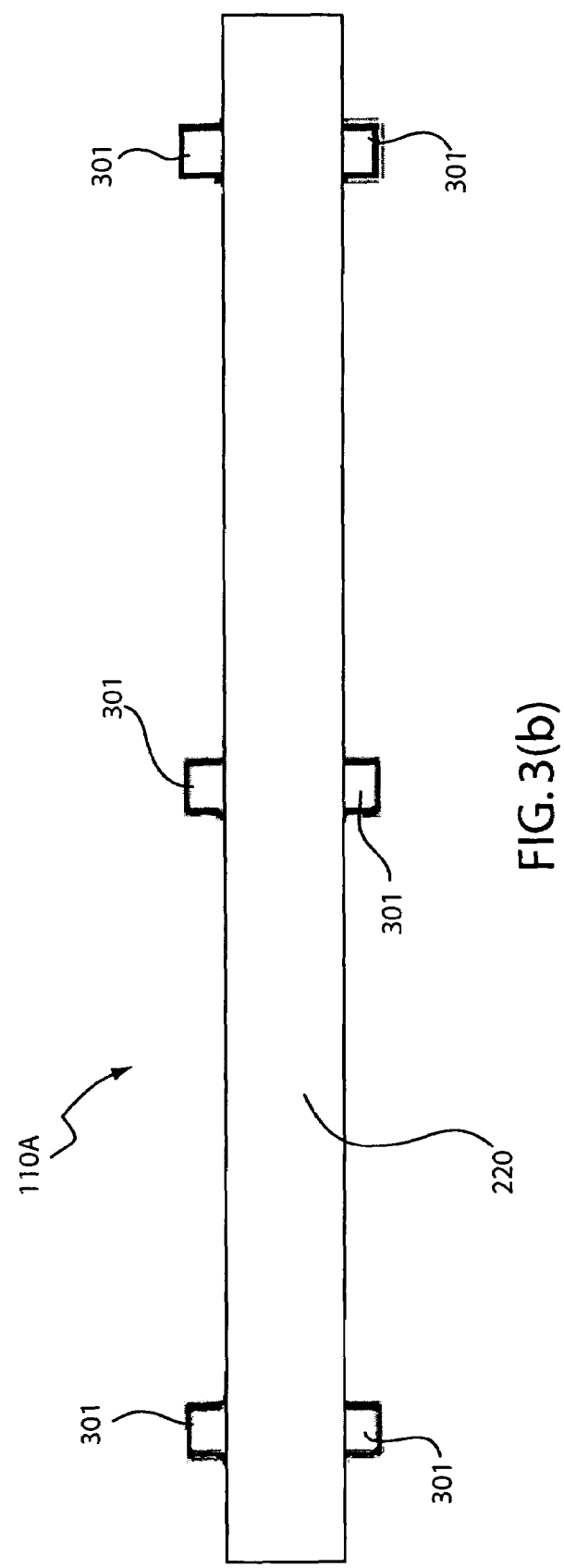

FIG. 3(b) schematically shows an interconnect shield 220 over an interconnect 210, in accordance with an embodiment of the present invention. The interconnect shield 220 is preferably less than about 0.004" thick to minimize the bending of the tabs 301 for attachment to contact points on the solar cells 100. For aesthetic reasons, the interconnect shield 220 is preferably of the same or similar color as the back sheets (e.g., see back sheet 703 in FIGS. 7 and 8) of the solar cell module (e.g., white interconnect shield 220 with white back sheets, black interconnect shield 220 with black back sheets). The interconnect shield 220 also preferably provides relatively good electrical isolation to minimize the occurrence of electrical shorts due to misaligned tabs 301. The interconnect shield 220 preferably comprises a single-sided tape that is placed adhesive-side toward the cells to produce a visually-appealing surface of the tape toward the front side of the module and to act as a cell locator prior to attachment of the interconnect. An equally-preferred embodiment is the use of a double-sided tape to allow the interconnect shield to be attached to the interconnect 210 and still provide an outward facing adhesive surface for attachment to the solar cells 100. Thus, the interconnect shield 220 may comprise a single-sided or double-sided tape depending on the application. The interconnect shield 220 may have an integral coating that visually blocks the interconnect. The interconnect shield 220 may comprise a 6.2 mm wide polyester tape with an acrylic-based adhesive, for example. In one embodiment, the interconnect shield 220 comprises a 3M 850 tape from the 3M company.

Figure 4:
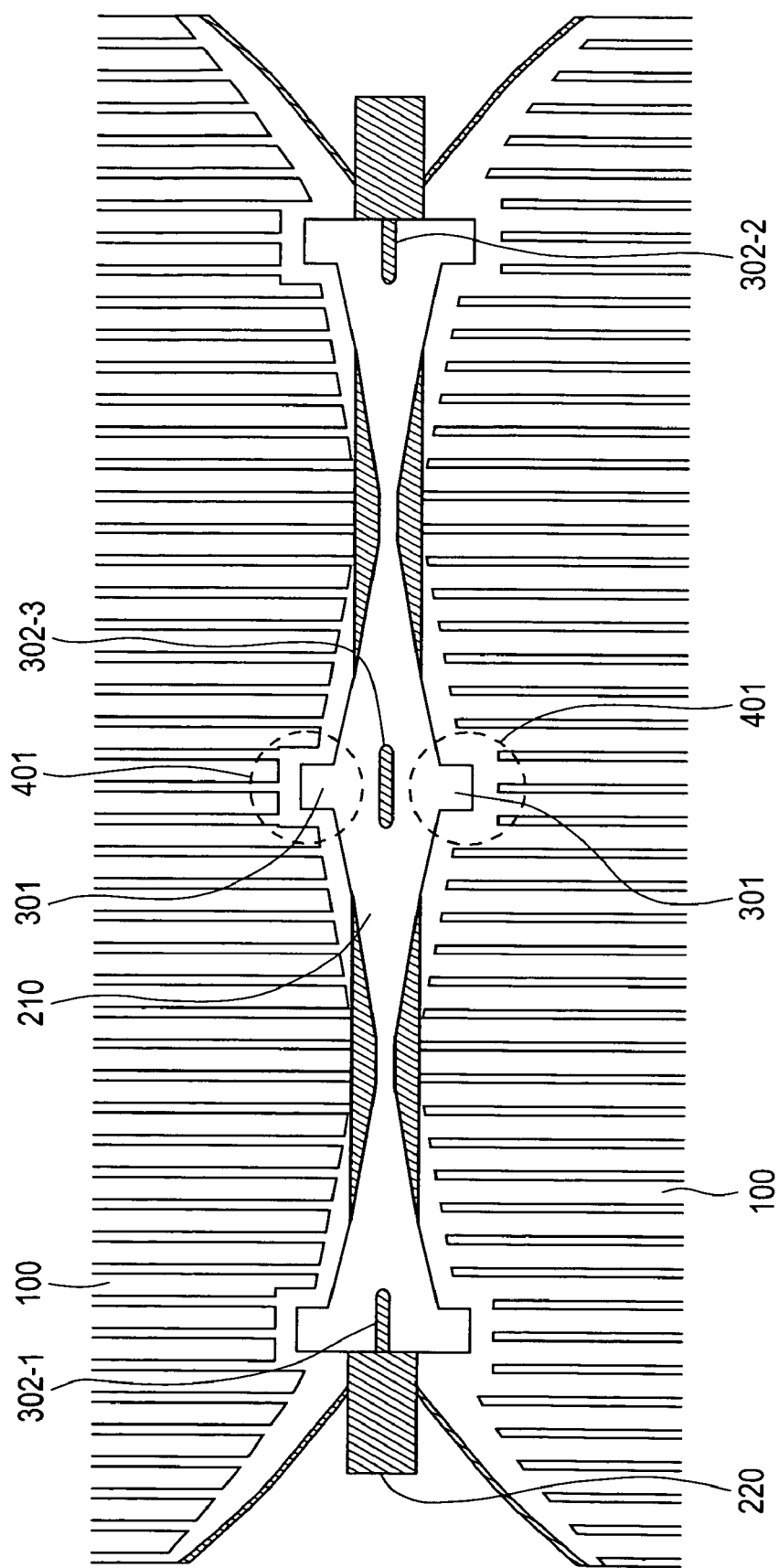
FIG. 4 schematically shows a close up view of an interconnect, an interconnect shield, and solar cells in accordance with an embodiment of the present invention.

FIG. 4 schematically shows a close up view of an interconnect shield 220 pressed onto the backsides of the solar cells 100, and an interconnect 210 pressed onto the interconnect shield 220. In the example of FIG. 4, the bodies of the outer regions of the interconnect 210 (compare slit 302-3 to slits 302-1 and 302-2) are cut for proper fit with the solar cells 100. Dashed regions 401 generally show the areas of the solar cells 100 having contact points for tabs 301.

Figure 5A:
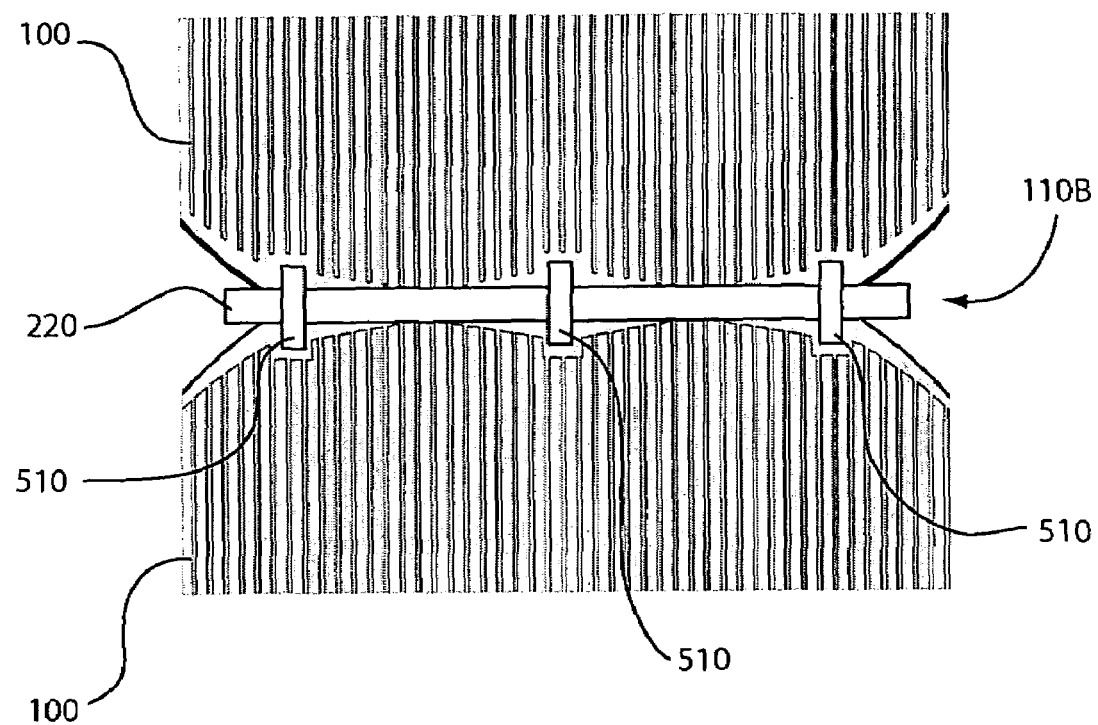
FIGS. 5(*a*) and 5(*b*) schematically show the backsides and front sides, respectively, of solar cells interconnected using an interconnect assembly in accordance with an embodiment of the present invention.
Figure 5B:
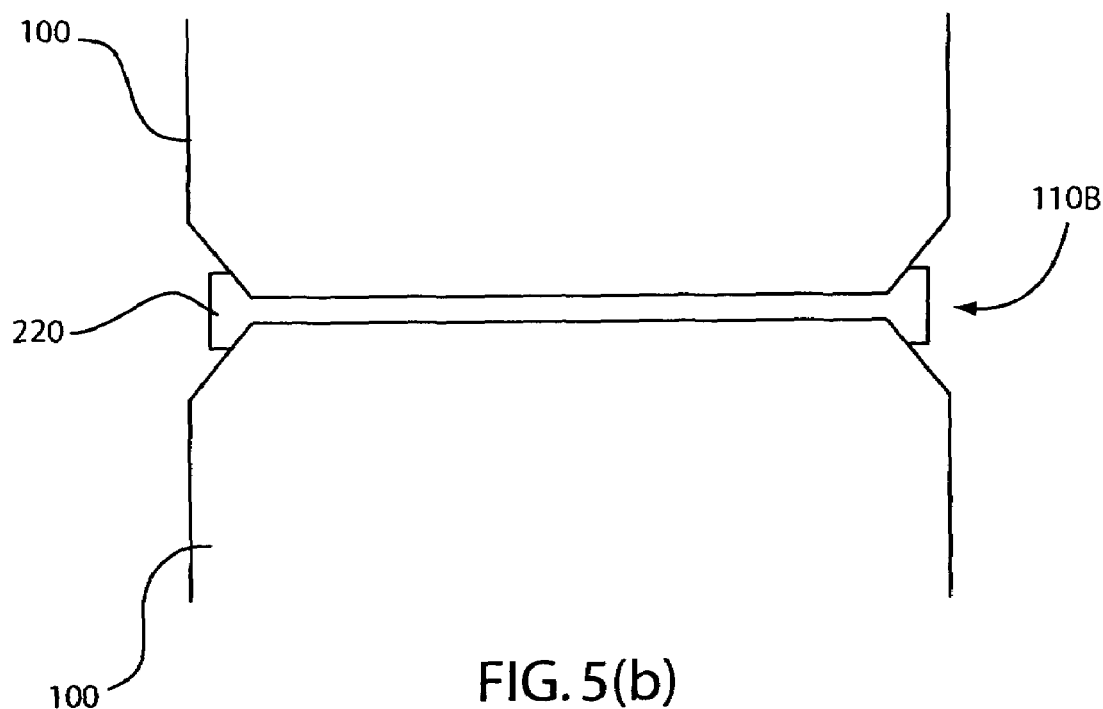

FIG. 5(a) schematically shows the backsides of solar cells 100 that are electrically connected together using an interconnect assembly 110B, in accordance with an embodiment of the present invention. The interconnect assembly 110B is a specific embodiment of the interconnect assemblies 110 shown in FIG. 1. In the example of FIG. 5(a), the interconnect assembly 110B comprises interconnects 510 and an interconnect shield 220. The interconnects 510, which are also referred to as "ribbons," are regarded as a multi-piece design in that several interconnects 510 are needed to electrically connect one solar cell 100 to another solar cell 100. The interconnect shield 220 may be applied to the backsides of the solar cells 100 prior to attaching each interconnect 510 to corresponding contact points on the backsides of the solar cells 100. In one embodiment, the interconnects 510 are soldered to solder pads on the backsides of the solar cells 100. FIG. 5(b) schematically shows the front sides of the solar cells 100 of FIG. 5(a). The interconnect shield 220 serves the same purpose and provides the same advantages in interconnect assemblies 110B and 110A.

Figure 6A:
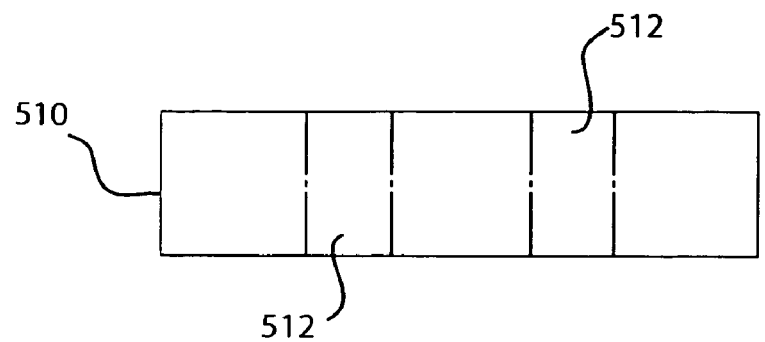
FIGS. 6(*a*)-6(*c*) schematically show various views of an interconnect in accordance with an embodiment of the present invention.
Figure 6B:
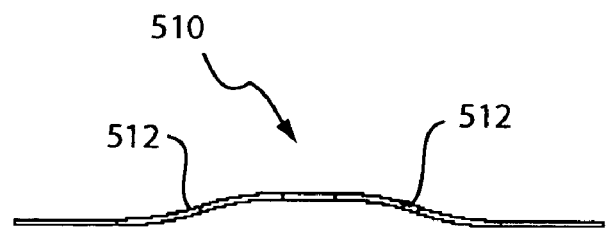
Figure 6C:
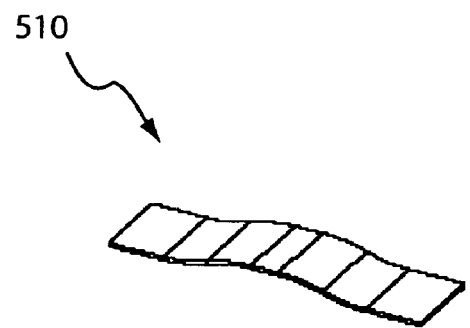

FIGS. 6(a)-6(b) schematically show various views of an interconnect 510 in accordance with an embodiment of the present invention. FIG. 6(a) shows a top view of the interconnect 510, which may comprise a strip of electrically conductive material. In one embodiment, the interconnect 510 includes portions 512 that are curved for strain relief. FIG. 6(b) shows a side view of the interconnect 510 illustrating the curved portions 512. FIG. 6(c) shows a perspective view of the interconnect 510.

FIG. 7 schematically shows a cross-section of a solar cell module 150A in accordance with an embodiment of the present invention. The solar cell module 150A is a specific embodiment of the solar cell module 150 shown in FIG. 1. In the example of FIG. 7, the solar cell module 150A includes a transparent cover 701, encapsulants 702 (i.e., 702-1, 702-2), solar cells 100, an interconnect shield 220, a back sheet 703, and one or more interconnects 710. Interconnect(s) 710 may be a single interconnect 210 or several interconnects 510. The interconnect shield 220 has already been described above.

In one embodiment, the solar cell module 150A is a so-called "terrestrial solar cell module" in that it is typically used in stationary applications, such as on residential or commercial building rooftops. As such, the solar cell module 150A is installed with the transparent cover 701 facing the sun. In one embodiment, the transparent cover 701 comprises glass. The front sides 721 of the solar cells 100 face towards the sun by way of the transparent cover 701. Encapsulants 702 crosslink and bond the solar cells 100, the cover 701, and the back sheet 703 to form a protective package. In one embodiment, the encapsulants 702 comprise poly-ethyl-vinyl acetate ("EVA").

The backsides 722 of the solar cells 100 face the back sheet 703, which is attached to the encapsulant 702-2. In one embodiment, the back sheet 703 comprises Tedlar/Polyester/EVA ("TPE") from the Madico company. In the TPE, the Tedlar is the outermost layer that protects against the environment, the polyester provides additional electrical isolation, and the EVA is non-crosslinked thin layer that promotes adhesion to the encapsulant 702-2. Alternatives to TPE for use as the back sheet 703 include Tedlar/Polyester/Tedlar ("TPT").

As shown in FIG. 7, the solar cell module 150A provides several layers of protection for the solar cells 100, with the cover 701 being the front layer, the encapsulant 702-1 being the layer between the front sides 721 and the cover 701, the encapsulant 702-2 being the layer between the backsides 722 and the back sheet 703, and the back sheet 703 being the back layer. The cover 701 and the encapsulant 702-1 form a front protective and isolating layer, while the encapsulant 702-2 and the back sheet 703 form a back protective and isolating layer. These layers of protection advantageously allow the solar cell module 150A to be exposed to the environment for many years (e.g., greater than 25 years) without forming a low resistance path from the relatively high voltages (e.g., 600-1000V relative to ground) of the solar cell array to ground.

Referring to FIG. 8, there is schematically shown a cross-section of a solar cell module 150B in accordance with an embodiment of the present invention. The solar cell module 150B is the same as the solar cell module 150A except for the use of an interconnect shield 220A rather than an interconnect shield 220. The interconnect shield 220A is a specific embodiment of the interconnect shield 220. In the example of FIG. 8, the interconnect shield 220A has a three-dimensional shape to allow it to press on the backsides 722 and to fill the gap between solar cells 100. This advantageously makes the interconnect shield 220A even more effective as a cell-to-cell spacer for solar cell alignment and spacing control.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell module comprising:
   a first backside-contact solar cell having a plurality of spaced apart contact points of a positive electrical polarity on one end and a plurality of spaced apart contact points of a negative electrical polarity on another end;
   a second backside-contact solar cell having a plurality of spaced apart contact points of the positive electrical polarity on one end and a plurality of spaced apart contact points of the negative electrical polarity on another end;
   an interconnect electrically coupling multiple said contact points of the positive electrical polarity on a backside of the first backside-contact solar cell to multiple said contact points of the negative electrical polarity on a backside of the second backside-contact solar cell; and
   a shield placed between the interconnect and the first and second backside contact solar cells, the shield comprising a material which visually blocks the interconnect as viewed from front sides of the first and second backside-contact solar cells.

2. The solar cell module of claim 1 wherein the shield comprises a tape.

3. The solar cell module of claim 1 wherein the shield comprises a coating integral to the interconnect.

4. The solar cell module of claim 1 wherein the shield comprises a three-dimensional body that presses on the backsides of the first and second backside contact solar cells and fills a gap between the first and second backside contact solar cells.

5. The solar cell module of claim 1 wherein the interconnect comprises a first strip of interconnect material electrically coupling a first contact point on the backside of the first backside-contact solar cell to a first contact point on the backside of the second backside-contact solar cell.

6. The solar cell module of claim 1 wherein the interconnect comprises a single continuous interconnect having a plurality of strain relief features.

7. The solar cell module of claim 6 wherein the interconnect comprises a plurality of tabs extending from the body of the interconnect to electrically couple contact points on the backside of the first backside-contact solar cell to corresponding contact points on the backside of the second backside-contact solar cell.

8. The solar cell module of claim 1 further comprising:
a first protection layer placed over the front sides of the first and second backside contact solar cells, the first protection layer being configured to allow solar energy to reach the front sides of the first and second backside-contact solar cells.

9. The solar cell module of claim 8 further comprising:
a second protection layer over the first protection layer, the second protection layer being configured to protect from environmental elements while allowing solar energy to reach the first and second backside-contact solar cells.

10. The solar cell module of claim 9 further comprising:
a third protection layer placed over the interconnect.

11. The solar cell module of claim 10 wherein the first and third protection layers comprise ethylene vinyl acetate (EVA) and the second protection layer comprises glass.

12. The solar cell module of claim 10 further comprising a back sheet on a side of the third protection layer away from the interconnect.

13. A solar cell module comprising:
a first solar cell having a plurality of spaced apart contact points of a positive electrical polarity on one end and a plurality of spaced apart contact points of a negative electrical polarity on another end;
a second solar cell having a plurality of spaced apart contact points of the positive electrical polarity on one end and a plurality of spaced apart contact points of the negative electrical polarity on another end; and
an interconnect assembly electrically coupling multiple said contact points of the positive electrical polarity on a backside of the first solar cell to multiple said contact points of the negative electrical polarity on a backside of the second solar cell, the interconnect assembly including an interconnect and an interconnect shield, the interconnect shield being located between the interconnect and the first and second solar cells, the interconnect shield being configured to block from view the interconnect as viewed from front sides of the first and second solar cells.

14. The solar cell module of claim 13 wherein the interconnect comprises a single continuous piece of electrically conducting material having a plurality of tabs for contacting contact points on the backsides of the first and second solar cells.

15. The solar cell module of claim 14 wherein the interconnect further comprises:
a plurality of slits for providing strain relief to the interconnect.

16. The solar cell module of claim 13 further comprising:
a first encapsulant over front sides of the first and second solar cells;
a second encapsulant over the backsides of the first and second solar cells;
a transparent cover over the first encapsulant; and
a back sheet over the second encapsulant.

17. The solar cell module of claim 13 wherein the interconnect shield fills a gap between the first and second solar cells to control spacing between the first and second solar cells.

* * * * *